(12) United States Patent
Watanabe et al.

(10) Patent No.: US 11,942,520 B2
(45) Date of Patent: Mar. 26, 2024

(54) SEMICONDUCTOR FILM

(71) Applicant: NGK INSULATORS, LTD., Nagoya (JP)

(72) Inventors: Morimichi Watanabe, Nagoya (JP); Hiroshi Fukui, Obu (JP)

(73) Assignee: NGK INSULATORS, LTD., Nagoya (JP)

( * ) Notice: Subject to any disclaimer, the term of this patent is extended or adjusted under 35 U.S.C. 154(b) by 163 days.

(21) Appl. No.: 17/450,705

(22) Filed: Oct. 13, 2021

(65) Prior Publication Data
US 2022/0028982 A1  Jan. 27, 2022

Related U.S. Application Data

(63) Continuation of application No. PCT/JP2019/035513, filed on Sep. 10, 2019.

(30) Foreign Application Priority Data

Apr. 24, 2019 (WO) .................. PCT/JP2019/017515

(51) Int. Cl.
| | |
|---|---|
| *H01L 29/24* | (2006.01) |
| *C30B 25/18* | (2006.01) |
| *C30B 29/16* | (2006.01) |
| *H01L 21/02* | (2006.01) |
| *H01L 29/04* | (2006.01) |

(52) U.S. Cl.
CPC .............. *H01L 29/24* (2013.01); *C30B 25/18* (2013.01); *C30B 29/16* (2013.01); *H01L 21/0242* (2013.01); *H01L 21/02488* (2013.01); *H01L 21/02565* (2013.01); *H01L 21/0262* (2013.01); *H01L 29/045* (2013.01)

(58) Field of Classification Search
CPC ......... C30B 25/18; C30B 29/16; H01L 29/24; H01L 21/0242; H01L 21/02565; H01L 21/0262

See application file for complete search history.

(56) References Cited

U.S. PATENT DOCUMENTS

| | | | |
|---|---|---|---|
| 9,711,590 B2 * | 7/2017 | Kaneko | ............... H01L 21/0262 |
| 10,992,103 B1 * | 4/2021 | Komada | ............. H01S 5/02326 |

(Continued)

FOREIGN PATENT DOCUMENTS

| | | |
|---|---|---|
| JP | 05-254991 A1 | 10/1993 |
| JP | 2014-072533 A1 | 4/2014 |

(Continued)

OTHER PUBLICATIONS

International Search Report and Written Opinion (Application No. PCT/JP2019/035513) dated Nov. 26, 2019 (with English translation).

(Continued)

*Primary Examiner* — Jaehwan Oh

(74) *Attorney, Agent, or Firm* — BURR PATENT LAW, PLLC

(57) ABSTRACT

Provided is a semiconductor film having a corundum-type crystal structure composed of $\alpha$-$Ga_2O_3$ or an $\alpha$-$Ga_2O_3$ solid solution and the crystal defect density on at least one surface of the semiconductor film is $1.0 \times 10^6/cm^2$ or less.

7 Claims, 3 Drawing Sheets

(56) References Cited

U.S. PATENT DOCUMENTS

| | | | |
|---|---|---|---|
| 11,088,242 B2* | 8/2021 | Matsuda | H01G 4/10 |
| 11,488,821 B2* | 11/2022 | Takahashi | H01L 21/02505 |
| 2015/0194479 A1* | 7/2015 | Kaneko | C30B 29/22 |
| | | | 257/43 |
| 2019/0057865 A1 | 2/2019 | Oshima et al. | |

FOREIGN PATENT DOCUMENTS

| | | |
|---|---|---|
| JP | 2014-234344 A1 | 12/2014 |
| JP | 2016-025256 A1 | 2/2016 |
| JP | 2016-155714 A1 | 9/2016 |

OTHER PUBLICATIONS

Jinno et al., "Reduction in Edge Dislocation Density in Corundum-Structured $\alpha$-GA$_2$O$_3$ Layers on Sapphire Substrates with Quasi-Graded $\alpha$-(AL,GA)$_2$O$_3$ Buffer Layers," *The Japan Society of Applied Physics*, Jun. 1, 2016, vol. 9, 071101-1 to 071101-4.

Akaiwa et al., "Conductivity control of Sn-doped $\alpha$-Ga$_2$O$_3$ thin films grown on sapphire substrates," *The Japanese Journal of Applied Physics*, (2016), vol. 55, pp. 1202BA-1-1202BA-8.

Masuda et al., "Fabrication of Ga$_2$O$_3$ on sapphire substrate with particles of Au," *The Japan Society of Applied Physics*, (2018), p. 19a-224A-5.

Y. Oshima et al., "Epitaxial Lateral Overgrowth of $\alpha$-Ga$_2$O$_3$ by Halide Vapor Phase Epitaxy," *APL Materials*, American Institute of Physics, vol. 7, No. 2, Dec. 10, 2018. pp. 022503-1 to 022503-6 (6 pages).

Kazuaki Akaiwa et al., "Electrical Conductive Corundum-Structured $\alpha$-GA$_2$O$_3$ Thin Films on Sapphire with Tin-Doping Grown by Spray-Assisted Mist Chemical Vapor Deposition," *The Japanese Journal of Applied Physics*, vol. 51, Jun. 14, 2021, pp. 070203-1 to 070203-3 (3 pages).

Extended European Search Report (Application No. 19925739.5) dated Nov. 30, 2022.

\* cited by examiner

SEMICONDUCTOR FILM

CROSS-REFERENCE TO RELATED APPLICATIONS

This application is a continuation application of PCT/JP2019/035513 filed Sep. 10, 2019, which claims priority to PCT/JP2019/017515 filed Apr. 24, 2019, the entire contents all of which are incorporated herein by reference.

BACKGROUND OF THE INVENTION

1. Field of the Invention

The present invention relates to a semiconductor film. In particular, the present invention relates to an $\alpha$-$Ga_2O_3$ based semiconductor film having remarkably few crystal defects.

2. Description of the Related Art

In recent years, gallium oxide ($Ga_2O_3$) has been attracting attention as a material for semiconductors. Gallium oxide is known to have five crystal forms of $\alpha$, $\beta$, $\gamma$, $\delta$, and $\epsilon$, and among them, $\alpha$-$Ga_2O_3$, which is a semi-stable phase, has a very large band gap of 5.3 eV, and is expected as a material for power semiconductors.

For example, Patent Literature 1 (JP2014-72533A) discloses a semiconductor device including a base substrate having a corundum-type crystal structure, a semiconductor layer having a corundum-type crystal structure, and an insulating film having a corundum-type crystal structure, and describes an example in which an $\alpha$-$Ga_2O_3$ film is formed as a semiconductor layer on a sapphire substrate. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode. In the examples of Patent Literature 2, it is disclosed that a diode is prepared by forming an $\alpha$-$Ga_2O_3$ film having a corundum structure which is a metastable phase as an n-type semiconductor layer and an $\alpha$-$Rh_2O_3$ film having a hexagonal crystal structure as a p-type semiconductor layer on a c-plane sapphire substrate.

It is known that, in these semiconductor devices, better characteristics can be obtained when there are fewer crystal defects in the material. In particular, since a power semiconductor is required to have excellent voltage endurance characteristics, it is desirable to reduce crystal defects. This is because the dielectric breakdown electric field characteristics depend on the number of crystal defects. However, since $\alpha$-$Ga_2O_3$ is a metastable phase, a single-crystal substrate has not been put into practical use, and the single-crystal substrate is generally formed by heteroepitaxial growth on a sapphire substrate. However, in such a case, it is known that a large number of crystal defects due to the difference in lattice constant with sapphire are included. For example, Non-Patent Literature 1 (Applied Physics Express, vol. 9, pages 071101-1 to 071101-4) discloses that there are lattice mismatches of 3.54% and 4.81% in the c-axis direction and the a-axis direction, respectively, between the $\alpha$-$Ga_2O_3$ and the sapphire substrate, and defects are generated in $\alpha$-$Ga_2O_3$ due to the mismatches, and that the edge dislocation density is $7 \times 10^{10}$ $cm^{-2}$.

Under these circumstances, a method of forming a buffer layer between sapphire and $\alpha$-$Ga_2O_3$ layer has been reported to reduce crystal defects in $\alpha$-$Ga_2O_3$. For example, Non-Patent Literature 1 discloses an example in which edge dislocations and screw dislocations are $3 \times 10^8 / cm^2$ and $6 \times 10^8 / cm^2$, respectively, by introducing a $(Al_x, Ga_{1-x})_2O_3$ layer (x=0.2 to 0.9) as a buffer layer between sapphire and an $\alpha$-$Ga_2O_3$ layer.

CITATION LIST

Patent Literature

Patent Literature 1: JP2014-72533A
Patent Literature 2: JP2016-25256A

Non-Patent Literature

Non-Patent Literature 1: Riena Jinno et al., Reduction in edge dislocation density in corundum-structured $\alpha$-$Ga_2O_3$ layers on sapphire substrates with quasi-graded $\alpha$-(Al, Ga)$_2O_3$ buffer layers, Applied Physics Express, Japan, The Japan Society of Applied Physics, Jun. 1, 2016, vol. 9, pages 071101-1 to 071101-4

SUMMARY OF THE INVENTION

However, since power semiconductors are required to have a high voltage endurance, the method of introducing a buffer layer as disclosed in Non-Patent Literature 1 also requires further reduction of crystal defect. The present inventors have now found that a semiconductor film having remarkably few crystal defects can be provided.

Therefore, an object of the present invention is to provide a semiconductor film having remarkably few crystal defects.

According to an aspect of the present invention, there is provided a semiconductor film having a corundum-type crystal structure composed of $\alpha$-$Ga_2O_3$ or an $\alpha$-$Ga_2O_3$ solid solution, wherein at least one surface of the semiconductor film has a crystal defect density of $1.0 \times 10^6 / cm^2$ or less.

DETAILED DESCRIPTION OF THE INVENTION

Semiconductor Film

Figure 1:
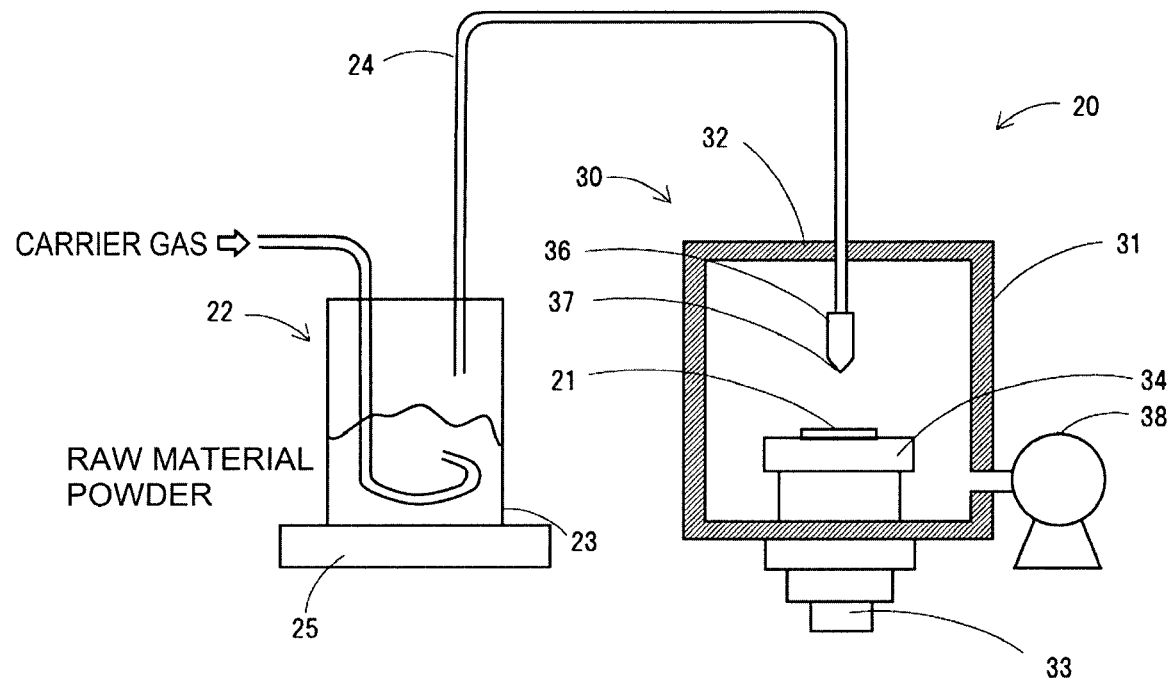
FIG. 1 is a schematic cross-sectional view showing a configuration of an aerosol deposition (AD) apparatus.

The semiconductor film of the present invention has a corundum-type crystal structure composed of $\alpha$-$Ga_2O_3$ or an $\alpha$-$Ga_2O_3$ solid solution. $\alpha$-$Ga_2O_3$ belongs to a trigonal crystal group and has a corundum-type crystal structure. Further, the $\alpha$-$Ga_2O_3$ solid solution is a solid solution in which other components are dissolved in $\alpha$-$Ga_2O_3$, and the corundum-type crystal structure is maintained.

In the $\alpha$-$Ga_2O_3$ based semiconductor film of the present invention, the crystal defect density on at least one surface thereof is $1.0\times10^6/\text{cm}^2$ or less, preferably $1.0\times10^5/\text{cm}^2$, more preferably $4.0\times10^3/\text{cm}^2$ or less, and still more preferably $1.0\times10^3/\text{cm}^2$ or less. Such a semiconductor film having an extremely low crystal defect density is excellent in dielectric breakdown electric field characteristics and is suitable for application in power semiconductors. The lower limit of the crystal defect density is not particularly limited and is preferably low. Further, in a case where a functional layer is formed on (or inside) the surface of such a semiconductor film having a low crystal defect density, it is preferable because the crystal defects do not propagate inside the functional layer. Note that as used herein, the "at least one surface" means at least one of two main surfaces (that is, a film surface or a plate surface) of a semiconductor film opposing each other, regardless of the top surface or the bottom surface. Note that as used herein, the "surface" means a surface forming the outside of an object, and it does not matter whether the surface is exposed to the outside (for example, the surface may be in contact with or coupled to another object). On the other hand, the "top surface" means a surface opposite the "bottom surface".

The crystal defect density of the semiconductor film is preferably smaller on one surface of the semiconductor film (hereinafter, referred to as "top surface") than on a surface opposite the surface (hereinafter referred to as "bottom surface"). In other words, it is preferable to satisfy the relationship of (crystal defect density on bottom surface)/(crystal defect density on top surface)>1. For example, when a semiconductor film is formed on a base substrate for film formation and the crystal defect density of a surface on a film forming side and a surface opposite the surface (surface adjacent to the base substrate for film formation) are evaluated, the crystal defect density of the surface on the film forming side may be smaller than the crystal defect density of the surface adjacent to the base substrate for film formation. At this time, when the side with a small crystal defect density is the top surface and the side in contact with the base substrate for film formation is the bottom surface, (crystal defect density on bottom surface)/(crystal defect density on top surface)>1 is satisfied. This relationship means that crystal defects are reduced during the formation of the semiconductor film. In such a film, a high-quality functional layer having a small crystal defect density or the like can be formed by forming a functional layer on (or inside) the surface having a small crystal defect density. Also, in a case where a semiconductor film prepared on a base substrate for film formation is separated and reprinted on another support substrate for use, it is preferable to form the functional layer on (or inside) the surface on the side with a small crystal defect density to obtain a high-quality functional layer. Specifically, the ratio of the crystal defect density on a surface (bottom surface) opposite one surface (top surface) of the semiconductor film to a crystal defect density on the one surface of the semiconductor film preferably exceeds 1.0, more preferably 1.2 or more, still more preferably 2.0 or more, particularly preferably 10 or more, and most preferably 100 or more. Further, the upper limit of the ratio of the crystal defect density on the bottom surface of the semiconductor film to the crystal defect density on the top surface of the semiconductor film is not particularly limited, but is, for example, 1000 or less. Here, as described above, the bottom surface of the semiconductor film refers to the surface on the side opposite the surface (top surface) on the side with a small crystal defect density, but typically refers to the surface on the side that is adjacent to (or was adjacent to) the base substrate used for forming the semiconductor film.

The crystal defect density of the $\alpha$-$Ga_2O_3$ based semiconductor film can be evaluated by plane TEM observation (plan view) or cross-section TEM observation. For example, when performing plane TEM observation of the semiconductor film surface, it can be performed using a general transmission electron microscope. For example, in a case where H-90001UHR-I manufactured by Hitachi is used as the transmission electron microscope, TEM observation may be performed at an acceleration voltage of 300 kV. The test piece used for TEM observation is preferably such that a sample is cut out so as to include one surface of the semiconductor film, and a measurement field of view of 50 μm×50 μm can be observed. More specifically, the test piece may be processed by ion milling so that the region of the measurement field of view of 4.1 μm×3.1 μm can be observed at eight or more places and the thickness around the measurement field of view is 150 nm. The crystal defect density can be evaluated from the plane TEM image of the surface of the test piece thus obtained. Similarly, in the case of performing plane TEM observation of the surface (bottom surface) on the side opposite the semiconductor film surface (top surface) observed, a test piece may be cut out so as to include the semiconductor film bottom surface, and TEM observation may be performed. Further, in a case where the semiconductor film is thin, it is also possible to evaluate the defect density of the top surface and the bottom surface at the same time by cross-section TEM observation of the film. In a case where the crystal defect density is low and it is difficult to observe the crystal defects by plane TEM observation, other known methods, for example, etch pit evaluation by wet etching, can also be used.

The semiconductor film of the present invention may be composed of an $\alpha$-$Ga_2O_3$ solid solution in which one or more components selected from the group consisting of $Cr_2O_3$, $Fe_2O_3$, $Ti_2O_3$, $V_2O_3$, $Ir_2O_3$, $Rh_2O_3$, $In_2O_3$, and $Al_2O_3$ are dissolved in $\alpha$-$Ga_2O_3$. All of these components have a corundum-type crystal structure, and their lattice constants are relatively close to each other. Therefore, the metal atoms of these components easily replace Ga atoms in the solid solution. Further, by dissolving these components in solid solution, it becomes possible to control the band gap, electrical characteristics, and/or lattice constant of the semiconductor film. The amount of solid solution of these components can be appropriately changed according to the desired characteristics.

Incidentally, as a method for evaluating crystal defects and domain, a method is known in which X-ray rocking curve (XRC) measurement is performed on the (006) plane and the (104) plane of, and evaluation is performed with the full width at half maximum (FWHM) thereof. In XRC measurement, it is common to correct the warpage of the sample using a vacuum chuck or the like, but it is often difficult to correct the warpage in a case where the amount of warpage is large. Therefore, it can be said that the X-ray rocking curve full width at half maximum (hereinafter, referred to as XRC full width at half maximum) reflects not only crystal defects and domains but also the amount of warpage. In particular, the XRC full width at half maximum of the (104) plane reflects all of various defects such as threading edge dislocations and threading screw dislocations, the presence (mosaicity) of regions (domains) having different tilts (inclinations of crystal axes in the growth orientation) and twists (rotations of crystal axes in the surface plane), and the state of warpage, and therefore, the XRC full width at half maximum is suitable as an evaluation method for semiconductor films. The XRC full width at half maximum of the (104) plane on at least one surface of the semiconductor film of the present invention is preferably small, preferably 500 arcsec or less, more preferably 150 arcsec or less, still more preferably 100 arcsec or less, particularly preferably 50 arcsec or less, and most preferably 40 arcsec or less. There is no problem even if the XRC full width at half maximum of the (104) plane is equivalent to the full width at half maximum specific to the X-ray source used for measurement, 30 arcsec or more is actually preferable. When the XRC full width at half maximum is within the above range, there are few crystal defects, small mosaicity, and small warpage, and as a result, in a case where a functional layer is formed on (or inside) such a surface, a high-quality functional layer having even higher dielectric breakdown electric field characteristics or the like can be obtained.

The measurement of the XRC profile of the (104) plane for the $\alpha$-$Ga_2O_3$ based semiconductor film can be performed using a general XRD apparatus. For example, when D8-DISCOVER manufactured by Bruker-AXS is used as the XRD apparatus, 2θ, ω, χ, and φ may be adjusted to perform axial alignment so that the peak of the (104) plane of $\alpha$-$Ga_2O_3$ appears, and then measurement may be performed by under conditions of a tube voltage of 40 kV, a tube current of 40 mA, a collimator diameter of 0.5 mm, an anti-scattering slit of 3 mm, in a range of an ω=15.5 to 19.5°, an w step width of 0.005°, and a counting time of 0.5 seconds. This measurement is preferably performed after converting CuKα rays into parallel monochromatic light with a Ge (022) asymmetric reflection monochromator. The full width at half maximum in the XRC profile of the (104) plane can be determined by performing peak search after profile smoothing using XRD analysis software ("LEPTOS" Ver 4.03, manufactured by Bruker-AXS).

Further, the XRC full width at half maximum of the (006) plane on at least one surface of the semiconductor film of the present invention is also desirably small, preferably 50 arcsec or less, and more preferably 40 arcsec or less. There is no problem even if the XRC full width at half maximum of the (006) plane is equivalent to the full width at half maximum specific to the X-ray source used for measurement, 30 arcsec or more is actually preferable. The XRC full width at half maximum of the (006) plane reflects information on threading screw dislocations, tilts and warpages. Therefore, when the XRC full width at half maximum is within the above range, there are few crystal defects, small mosaicity, and small warpage, and as a result, even higher dielectric breakdown electric field characteristics can be obtained. The measurement of the XRC profile of the (006) plane for the $\alpha$-$Ga_2O_3$ based semiconductor film can also be performed using a general XRD apparatus. For example, the measurement conditions in the case of using D8-DISCOVER manufactured by Bruker-AXS as the XRD apparatus can be the same as the conditions described above for the (104) plane except that 2θ, ω, χ, and φ are adjusted to perform axial alignment so that the peak of the (006) plane of $\alpha$-$Ga_2O_3$ appears, and then ω is set to 18.0 to 22.0°.

The semiconductor film can contain a Group 14 element as a dopant at a proportion of $1.0\times10^{16}$ to $1.0\times10^{21}/cm^3$. Here, the term "Group 14 element" refers to a Group 14 element according to the periodic table formulated by the IUPAC (International Union of Pure and Applied Chemistry), and specifically, is any one of carbon (C), silicon (Si), germanium (Ge), tin (Sn) and lead (Pb). The amount of the dopant can be appropriately changed according to the desired characteristics, but is preferably $1.0\times10^{16}$ to $1.0\times10^{21}/cm^3$, and more preferably $1.0\times10^{17}$ to $1.0\times10^{19}/cm^3$. It is preferable that these dopants are uniformly distributed in the film and the concentrations on one surface (top surface) and the surface opposite the surface (bottom surface) are about the same. That is, it is preferable that the semiconductor film uniformly contains the Group 14 element as the dopant in the above proportion.

Further, it is preferable that the semiconductor film is an orientation film crystallographically oriented in a specific plane orientation, for example, a c-axis orientation film. The orientation of the semiconductor film can be examined by a known method, for example, by performing reverse pole figure orientation mapping using, an electron backscatter diffraction apparatus (EBSD).

The thickness of the semiconductor film may be appropriately adjusted from the viewpoint of cost and required characteristics. That is, it takes time to form a film when the film to be formed is too thick, so it is preferable that the film is not extremely thick from the viewpoint of cost. Further, in a case where a device that requires a particularly high dielectric strength is prepared, it is preferable to prepare a thick film. On the other hand, in a case where a device that requires conductivity in the vertical direction (thickness direction) is prepared, it is preferable to prepare a thin film. As described above, the film thickness may be appropriately adjusted according to the desired characteristics, but typically 0.3 to 50 μm, or 0.5 to 20 μm, or 0.5 to 10 μm. By setting the thickness in such a range, it is possible to achieve both cost and semiconductor characteristics. In a case where a self-standing semiconductor film is required, a thick film may be used, for example, 50 μm or more, or 100 μm or more, and there is no particular upper limit unless there is a cost limitation.

The semiconductor film has an area of preferably 20 $cm^2$ or more, more preferably 70 $cm^2$ or more, and still more preferably 170 $cm^2$ or more on one side thereof. By increasing the area of the semiconductor film in this way, it is possible to obtain a large number of semiconductor elements from one semiconductor film, and it is possible to reduce the manufacturing cost. The upper limit of the size of the semiconductor film is not particularly limited, but is typically 700 $cm^2$ or less on one side.

The semiconductor film may be in the form of a self-standing film of a single film or may be formed on a support substrate. The support substrate is preferably a substrate having a corundum structure and oriented in two axes, the c-axis and the a-axis (biaxial orientation substrate). By using a biaxial orientation substrate having a corundum structure as the support substrate, the semiconductor film can also serve as a seed crystal for heteroepitaxial growth (base substrate for film formation). The biaxial orientation substrate may be a polycrystal, a mosaic crystal (a set of crystals of which crystal orientations are slightly deviated), or a single-crystal. As long as it has a corundum structure, it may be composed of a single material or a solid solution of a plurality of materials. The main component of the support substrate is preferably a material selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$, and particularly preferably $\alpha$-$Cr_2O_3$, or a solid solution of $\alpha$-$Cr_2O_3$ and a different material.

Further, as a seed crystal for support substrate and heteroepitaxial growth (base substrate for film formation), a composite base substrate in which an orientation layer composed of a material having a corundum-type crystal structure having an a-axis length and/or a c-axis length larger than that of sapphire is formed on a corundum single crystal such as sapphire or $Cr_2O_3$ can be used. In this case, the orientation layer preferably contains a material selected from the group consisting of $\alpha$-$Cr_2O_3$, $\alpha$-$Fe_2O_3$, $\alpha$-$Ti_2O_3$, $\alpha$-$V_2O_3$, and $\alpha$-$Rh_2O_3$, or a solid solution containing two or more selected from the group consisting of $\alpha$-$Al_2O_3$, $\alpha$-$Cr_2O_3$, $\alpha$-$Fe_2O_3$, $\alpha$-$Ti_2O_3$, $\alpha$-$V_2O_3$, and $\alpha$-$Rh_2O_3$.

Further, the semiconductor film prepared on the base substrate for film formation may be separated and reprinted on another support substrate. The material of the other support substrate is not particularly limited, but a suitable material may be selected from the viewpoint of material properties. For example, from the viewpoint of thermal conductivity, a metal substrate made of Cu or the like, a ceramic substrate made of SiC, AlN or the like, is preferably used. It is also preferable to use a substrate having a coefficient of thermal expansion of 6 to 13 ppm/K at 25 to 400° C. That is, the semiconductor film is preferably provided on a support substrate having a coefficient of thermal expansion of 6 to 13 ppm/K at 25 to 400° C., and such a semiconductor film or composite material is also provided as a preferred embodiment of the present invention. By using a support substrate having such a coefficient of thermal expansion, the difference in thermal expansion between the semiconductor film and the support substrate can be reduced, and as a result, the occurrence of cracks in the semiconductor film due to thermal stress and the peeling of the film can be suppressed. An example of such a support substrate is a substrate made of a Cu—Mo composite material. The composite ratio of Cu and Mo can be appropriately selected in consideration of the matching of the coefficient of thermal expansion with the semiconductor film, the thermal conductivity, the conductivity and the like.

The supporting substrate for the semiconductor film is preferably any of a biaxial orientation substrate composed of $\alpha$-$Cr_2O_3$ or a solid solution of $\alpha$-$Cr_2O_3$ and a different material, or a composite substrate having an orientation layer composed of $\alpha$-$Cr_2O_3$ or a solid solution of $\alpha$-$Cr_2O_3$ and a different material. By doing so, the semiconductor film can also serve as both a seed crystal (base substrate for film formation) for heteroepitaxial growth and a support substrate, and the crystal defects in the semiconductor film can also be significantly reduced.

As described above, the semiconductor film of the present invention has remarkably few crystal defects and can exhibit high dielectric breakdown electric field characteristics. As far as the present inventor knows, a technique for obtaining a semiconductor film having such a low crystal defect density has not been conventionally known. For example, Non-Patent Literature 1 discloses that an $\alpha$-$Ga_2O_3$ layer is formed using a substrate in which a $(Al_x, Ga_{1-x})_2O_3$ layer (x=0.2 to 0.9) is introduced as a buffer layer between sapphire and the $\alpha$-$Ga_2O_3$ layer, and in the obtained $\alpha$-$Ga_2O_3$ layer, the densities of edge dislocations and screw dislocations are $3 \times 10^8/cm^2$ and $6 \times 10^8/cm^2$, respectively.

Method for Manufacturing Semiconductor Film

The production method of the semiconductor film is not particularly limited as long as a semiconductor film having a corundum-type crystal structure composed of $\alpha$-$Ga_2O_3$ or an $\alpha$-$Ga_2O_3$ solid solution can be formed so that the crystal defect density on at least one surface of the semiconductor film is $1.0 \times 10^6/cm^2$ or less. However, as described above, it is preferable to use any of a biaxial orientation substrate composed of $\alpha$-$Cr_2O_3$ or a solid solution of $\alpha$-$Cr_2O_3$ and a different material, or a composite base substrate having an orientation layer composed of $\alpha$-$Cr_2O_3$ or a solid solution of $\alpha$-$Cr_2O_3$ and a different material, as a base substrate for film formation. Hereinafter, the method for producing the semiconductor film will be described in the order of (1) preparation of a composite base substrate and (2) formation of a semiconductor film.

(1) Preparation of Composite Base Substrate

The composite base substrate can be preferably produced by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of sapphire, or a material capable of having a corundum-type crystal structure having an a-axis length and/or c-axis length larger than that of sapphire by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare the composite base substrate, first, a sapphire substrate is provided. The sapphire substrate used may have any orientation plane. That is, the sapphire substrate may have an $\alpha$-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire, or a material capable of having a corundum-type crystal structure having an a-axis length and/or c-axis length larger than that of sapphire by heat treatment is prepared. The method for forming the orientation precursor layer is not particularly limited, and a known method can be adopted. Examples of the method for forming the orientation precursor layer include an aerosol deposition (AD) method, a sol-gel method, a hydrothermal method, a sputtering method, an evaporation method, various chemical vapor deposition (CVD) methods, a PLD method, a chemical vapor transport (CVT) method, and a sublimation method. Examples of the CVD method include a thermal CVD method, a plasma CVD method, a mist CVD method, and an MO (metal organic) CVD method. Alternatively, a method may be used in which a molded body of the orientation precursor is prepared in advance and the molded body is placed on a sapphire substrate. Such a molded body can be produced by molding the material of the orientation precursor by a method such as tape casting or press molding. Further, it is also possible to use a method in which a polycrystal prepared in advance by various CVD methods, sintering, or the like is used as the orientation precursor layer and is placed on a sapphire substrate.

However, a method of directly forming the orientation precursor layer by using an aerosol deposition (AD) method, various CVD methods, or a sputtering method is preferred. By using these methods, a dense orientation precursor layer can be formed in a relatively short time, and heteroepitaxial growth using a sapphire substrate as a seed crystal can be easily caused. In particular, the AD method does not require a high vacuum process and has a relatively high film formation rate, and is therefore preferable in terms of production cost. In the case of using a sputtering method, a film can be formed using a target of the same material as that of the orientation precursor layer, but a reactive sputtering method in which a film is formed in an oxygen atmosphere using a metal target can also be used. A method of placing a molded body prepared in advance on sapphire is also preferable as a simple method, but since the orientation precursor layer is not dense, a process of densification is required in the heat treatment step described later. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

The AD method is a technique for forming a film by mixing fine particles or a fine particle raw material with a gas to form an aerosol, and impacting the aerosol on a substrate by injecting the aerosol at a high speed from a nozzle, and has a feature of forming a film densified at ordinary temperature. FIG. 1 shows an example of a film forming apparatus (aerosol deposition (AD) apparatus) used in such an AD method. The film forming apparatus 20 shown in FIG. 1 is configured as an apparatus used in an AD method in which a raw material powder is injected onto a substrate in an atmosphere having a pressure lower than atmospheric pressure. The film forming apparatus 20 includes an aerosol generating unit 22 that generates an aerosol of raw material powder containing raw material components, and a film forming unit 30 that forms a film containing the raw material components by injecting the raw material powder onto the sapphire substrate 21. The aerosol generating unit 22 includes an aerosol generating chamber 23 that stores raw material powder and receives a carrier gas supply from a gas cylinder (not shown) to generate an aerosol, and a raw material supply pipe 24 that supplies the generated aerosol to the film forming unit 30, and a vibrator 25 that applies vibration at frequencies of 10 to 100 Hz to the aerosol generating chamber 23 and the aerosol therein. The film forming unit 30 has a film forming chamber 32 that injects aerosols onto the sapphire substrate 21, a substrate holder 34 that is disposed inside the film forming chamber 32 and fixes the sapphire substrate 21, and an X-Y stage 33 that moves the substrate holder 34 in the X-Y axis direction. Further, the film forming unit 30 includes an injection nozzle 36 in which a slit 37 is formed at a tip thereof to inject aerosol into the sapphire substrate 21, and a vacuum pump 38 for reducing the pressure in the film forming chamber 32.

It is known that the AD method can control a film thickness, a film quality, and the like according to film forming conditions. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 32 and the injection nozzle 36, the opening area of the injection nozzle, and the like. If appropriate conditions are not used, the coating may become a green compact or generate pores, so it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 kgf/cm$^2$, and more preferably 150 to 300 kgf/cm$^2$. The molding method is not particularly limited, and in addition to press molding, tape casting, slip casting, extrusion molding, doctor blade method, and any combination thereof can be used. For example, in the case of using tape casting, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter and densify the molded body in the heat treatment step described later. Therefore, the molded body may contain trace components such as a sintering aid in addition to the material having or resulting in a corundum-type crystal structure.

(c) Heat Treatment of Orientation Precursor Layer on Sapphire Substrate

A heat treatment is performed on the sapphire substrate on which the orientation precursor layer is formed at a temperature of 1000° C. or more. By this heat treatment, at least a portion of the orientation precursor layer near the sapphire substrate can be converted into a dense orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned. For example, when a c-plane sapphire substrate is used, both the sapphire substrate and the orientation layer can be c-axis oriented with respect to the surface of the base substrate. Moreover, this heat treatment makes it possible to form a gradient composition region in a part of the orientation layer. That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing α-$Al_2O_3$.

It is known that methods such as various CVD methods, a sputtering method, a PLD method, a CVT method, and a sublimation method may cause heteroepitaxial growth on a sapphire substrate without heat treatment at 1000° C. or more. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the surface of the orientation layer. The reason for this is not clear, but it is considered that the crystal structure of the solid-phase orientation precursor layer once formed may be rearranged using sapphire as a seed, which may also be effective in eliminating crystal defects.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to perform sintering and densification during heat treatment, and normal pressure firing at a high temperature, hot pressing, HIP, or a combination thereof is suitable. For example, when using a hot press, the surface pressure is preferably 50 kgf/cm$^2$ or more, more preferably 100 kgf/cm$^2$ or more, particularly preferably 200 kgf/cm$^2$ or more, the upper limit is not particularly limited. The firing temperature is also not particularly limited as long as sintering, densification, and heteroepitaxial growth occur, but is preferably 1000° C. or more, more preferably 1200° C. or more, still more preferably 1400° C. or more, and particularly preferably 1600° C. or more. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

(2) Formation of Semiconductor Film

Next, a semiconductor film is formed on the orientation layer of the obtained composite base substrate. As for the method of forming a semiconductor film, as long as the semiconductor film having the characteristics specified in the present invention can be obtained, in other words, as long as the film can be formed so that crystal defect density on at least one surface of the semiconductor film is 1.0× 10$^6$/cm$^2$ or less, known methods can be used. However, any of the mist CVD method, HVPE method, MBE method, MOCVD method, hydrothermal method and sputtering method is preferable, and the mist CVD method, hydrothermal method or HVPE method is particularly preferable. Among these methods, the HVPE method will be described below.

The HVPE method (halide vapor phase epitaxy method) is a type of CVD and is a method applicable to film formation of compound semiconductors such as $Ga_2O_3$ and GaN. In this method, the Ga raw material and the halide are reacted to generate gallium halide gas, which is supplied onto the base substrate for film formation. At the same time, $O_2$ gas is supplied onto the base substrate for film formation, and the reaction between the gallium halide gas and the $O_2$ gas causes $Ga_2O_3$ to grow on the base substrate for film formation. This method has been widely used industrially due to its high speed and thick film growth capability, and examples of film formation of not only α-$Ga_2O_3$ but also β-$Ga_2O_3$ have been reported.

Figure 2:
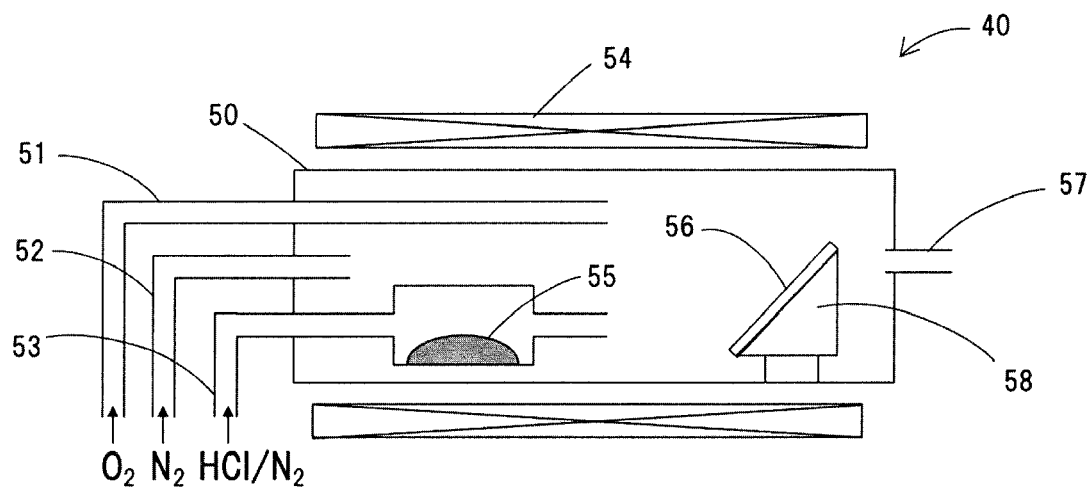
FIG. 2 is a schematic cross-sectional view showing a configuration of a vapor deposition apparatus using a HVPE method.

FIG. 2 shows an example of a vapor deposition apparatus using a HVPE method. A vapor deposition apparatus 40 using the HVPE method includes a reaction furnace 50, a susceptor 58 on which a base substrate for film formation 56 is placed, an oxygen raw material supply source 51, a carrier gas supply source 52, and a Ga raw material supply source 53, a heater 54, and a gas discharge unit 57. The reactor 50 may be any reactor that does not react with the raw material, such as a quartz tube. The heater 54 may be any heater capable of heating up to at least 700° C. (preferably 900° C. or higher), for example, a resistance heating type heater.

A metal Ga 55 is placed inside the Ga raw material supply source 53, and a halogen gas or a hydrogen halide gas, for example, HCl is supplied. The halogen gas or halogenated gas is preferably $Cl_2$ or HCl. The supplied halogen gas or halogenated gas reacts with the metal Ga 55 to generate gallium halide gas, which is supplied to the base substrate for film formation. The gallium halide gas preferably contains GaCl and/or GaCl$_3$. The oxygen raw material supply source 51 can supply an oxygen source selected from the group consisting of $O_2$, $H_2O$ and $N_2O$, and $O_2$ is preferable. These oxygen raw material gases are supplied to the base substrate for film formation for film formation at the same time as the gallium halide gas. The Ga raw material and the oxygen raw material gas may be supplied together with a carrier gas such as $N_2$ or a rare gas.

The gas discharge unit 57 may be connected to a vacuum pump such as a diffusion pump or a rotary pump, for example, and may control not only the discharge of unreacted gas in the reaction furnace 50 but also the inside of the reaction furnace 50 under reduced pressure. This can suppress the gas phase reaction and improve the growth rate distribution.

By heating the base substrate for film formation 56 to a predetermined temperature using the heater 54 and simultaneously supplying the gallium halide gas and the oxygen raw material gas, $\alpha$-$Ga_2O_3$ is formed on the base substrate for film formation 56. The film formation temperature is not particularly limited as long as $\alpha$-$Ga_2O_3$ is formed, but is typically 250° C. to 900° C., for example. The partial pressure of the Ga raw material gas and the oxygen raw material gas is also not particularly limited. For example, the partial pressure of the Ga raw material gas (gallium halide gas) may be in the range of 0.05 kPa or more and 10 kPa or less, and the partial pressure of the oxygen raw material gas may be in the range of 0.25 kPa or more and 50 kPa or less.

In a case where an $\alpha$-$Ga_2O_3$ based semiconductor film containing a Group 14 element is formed, or in the case where a mixed crystal film with $\alpha$-$Ga_2O_3$ containing an oxide of In or Al is formed as a dopant, these halides may be supplied from a separate supply source, or these halides may be mixed and supplied from the Ga raw material supply source 53. Further, a material containing a Group 14 element, In, Al or the like may be placed in the same place as the metal Ga 55, reacted with a halogen gas or a hydrogen halide gas, and supplied as a halide. These halide gas supplied to the base substrate for film formation 56 react with the oxygen raw material gas to form oxides in the same manner as gallium halide, and are incorporated into the $\alpha$-$Ga_2O_3$ based semiconductor film.

When forming a semiconductor film by the HVPE method, it is possible to form a film having a single-layer structure by keeping the supply amounts of Ga raw material, oxygen raw material, and the like constant and appropriately controlling the film forming conditions. In this way, a semiconductor film having a remarkably low surface crystal defect density of $1.0 \times 10^6/cm^2$ or less can be formed on the composite base substrate.

The semiconductor film of the present invention has a remarkably small warpage after formed on a base substrate for film formation or when separated from the base substrate for film formation to form a self-standing film. In particular, in the case of using any of a biaxial orientation substrate composed of $\alpha$-$Cr_2O_3$ or a solid solution of $\alpha$-$Cr_2O_3$ and a different material, or a composite substrate having an orientation layer composed of $\alpha$-$Cr_2O_3$ or a solid solution of $\alpha$-$Cr_2O_3$ and a different material, as a base substrate for film formation, the warpage amount can be particularly reduced. For example, the warpage amount in a case where a 2-inch size semiconductor film is prepared can be 30 μm or less, more preferably 20 μm or less, and still more preferably 10 μm or less.

As described above, the semiconductor film of the present invention can be a film with small mosaicity. The $\alpha$-$Ga_2O_3$ film formed on the conventional sapphire substrate may be an aggregate of domains (mosaic crystal) having slightly different crystal orientations. The cause of this is not clear, but it may be attributed to the fact that $\alpha$-$Ga_2O_3$ is a metastable phase and therefore the film formation temperature is relatively low. Since the film formation temperature is low, it is difficult for the adsorbed components to migrate on the substrate surface, thus suppressing step-flow growth. Therefore, the growth mode of island-shaped growth (three-dimensional growth) tends to be dominant. Further, in a case where a sapphire substrate is used as the base substrate for film formation, there may be a lattice mismatch between the semiconductor film and the sapphire, and each island-shaped growth part (domain) may have slightly different crystal orientation. For this reason, the domains do not meet completely and tend to form mosaic crystals. The semiconductor film of the present invention, in particular as base substrate for film formation, can be formed by using any of a single-crystal substrate composed of $\alpha$-$Cr_2O_3$ or a solid solution of $\alpha$-$Cr_2O_3$ and a different material, or a composite substrate having a single-crystal substrate composed of $\alpha$-$Cr_2O_3$ or a solid solution of $\alpha$-$Cr_2O_3$ and a different material, and in a case where the film formation conditions are properly controlled, a semiconductor film without mosaicity (that is, single-crystal) or with small mosaicity can be obtained. From the viewpoint of mosaicity, the film formation temperature is, for example, 600° C. or higher, preferably 700° C. or higher, more preferably 800° C. or higher, and still more preferably 900° C. or higher. In order to evaluate the mosaicity of the semiconductor film, known methods such as XRC measurement, EBSD measurement, and TEM can be used, but evaluation at a full width at half maximum in XRC as described above is particularly suitable.

The obtained semiconductor film can be formed as it is or divided into semiconductor elements. Alternatively, the semiconductor film may be peeled off from the composite base substrate to form a single film. In this case, in order to facilitate peeling from the composite base substrate, a semiconductor film in which a peeling layer is provided in advance on the orientation layer surface (film forming surface) of the composite base substrate may be used. Examples of such a release layer include those provided with a C injection layer and an H injection layer on the surface of the composite base substrate. Further, C or H may be injected into the film at the initial stage of film formation of the semiconductor film, and a release layer may be provided on the semiconductor film side. Furthermore, it is also possible to adhere and bond a support substrate (mounting substrate) different from the composite base substrate to the surface of the semiconductor film formed on the composite base substrate (that is, the opposite side of the composite base substrate), and then peel and remove the composite base substrate from the semiconductor film. As such a support substrate (mounting substrate), a substrate having a coefficient of thermal expansion at 25 to 400° C. of 6 to 13 ppm/K, for example, a substrate composed of a Cu—Mo composite material can be used. Further, example of the method of adhering and bonding the semiconductor film and the support substrate (mounting substrate) include known methods such as brazing, soldering, and solid phase bonding. Further, an electrode such as an ohmic electrode or a Schottky electrode, or another layer such as an adhesive layer may be provided between the semiconductor film and the support substrate.

EXAMPLES

The present invention will be described in more detail with reference to the following examples.

Example 1

A commercially available $Cr_2O_3$ single-crystal (size 8 mm×8 mm, thickness 0.5 mm, c-plane, no off-angle) (hereinafter, referred to as $Cr_2O_3$ substrate) was used as a base substrate for film formation, and an α-Ga$_2$O$_3$ film (semiconductor film) was formed as follows.

(1) Formation of α-Ga$_2$O$_3$ Film by Mist CVD Method (1a) Mist CVD Apparatus

Figure 3:
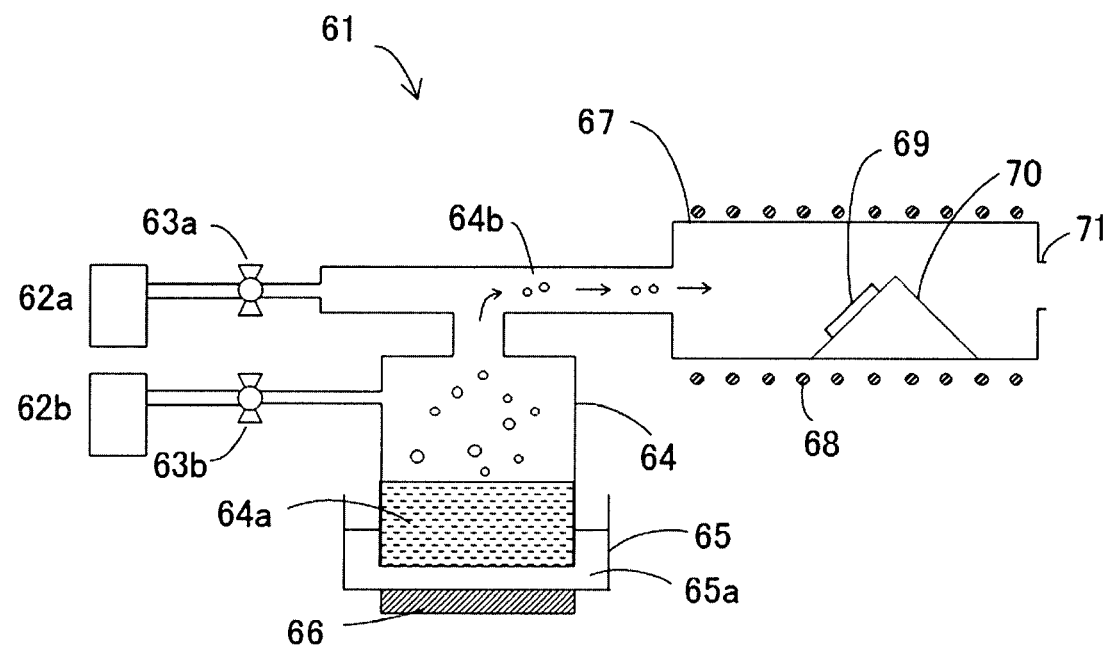
FIG. 3 is a schematic cross-sectional view showing a configuration of a mist chemical vapor deposition (CVD) apparatus.

FIG. 3 schematically shows a mist CVD apparatus 61 used in this example. The mist CVD apparatus 61 includes a dilution gas source 62a, a carrier gas source 62b, a flow control valve 63b, a mist generation source 64, a vessel 65, an ultrasonic vibrator 66, a quartz tube 67, a heater 68, a susceptor 70, and an exhaust port 71. A substrate 69 is placed on the susceptor 70. The flow control valve 63a is configured to be capable of controlling the flow rate of the dilution gas sent from the dilution gas source 62a, and the flow control valve 63b is configured to be capable of controlling the flow rate of the carrier gas sent from the carrier gas source 62b. The mist source 64 contains the raw material solution 64a, while the vessel 65 contains the water 65a. The ultrasonic vibrator 66 is attached to the bottom surface of the vessel 65. The quartz tube 67 forms a film forming chamber, and the heater 68 is installed around the quartz tube 67. The susceptor 70 is composed of quartz, and the surface on which the substrate 69 is placed is inclined from the horizontal plane.

(1b) Preparation of Raw Material Solution

An aqueous solution having a gallium acetylacetonate concentration of 0.05 mol/L was prepared. At this time, 36% hydrochloric acid was contained in a volume ratio of 1.5% to prepare a raw material solution 64a.

(1c) Preparation for Film Formation

The obtained raw material solution 64a was stored in the mist generation source 64. The base substrate for film formation (Cr$_2$O$_3$ substrate) was placed on the susceptor 70 as the substrate 69, and the heater 68 was operated to raise the temperature inside the quartz tube 67 to 600° C. Next, the flow control valves 63a and 63b were opened to supply the diluted gas and the carrier gas into the quartz tube 67 from the dilution gas source 62a and the carrier gas source 62b, respectively. After sufficiently replacing the atmosphere in the quartz tube 67 with a diluting gas and a carrier gas, the flow rates of the dilution gas and the carrier gas were adjusted to 0.5 L/min and 1 L/min, respectively. Nitrogen gas was used as the dilution gas and the carrier gas.

(1d) Film Formation

The ultrasonic vibrator 66 was vibrated at 2.4 MHz, and the vibration was propagated to the raw material solution 64a through the water 65a to mist the raw material solution 64a and generate mist 64b. The mist 64b was introduced into the quartz tube 67 as a film forming chamber by the dilution gas and the carrier gas, and reacted in the quartz tube 67 to form a film on the substrate 69 by the CVD reaction on the surface of the substrate 69. Thus, a crystalline semiconductor film (semiconductor layer) was obtained. The film formation time was 60 minutes.

(2) Evaluation of Semiconductor Film (2a) Surface EDS

As a result of EDS measurement of the film surface of the obtained film on the film forming side (that is, the side opposite to the Cr$_2$O$_3$ substrate), only Ga and O were detected, and it was found that the obtained film was a Ga oxide.

(2b) EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the surface of the film on the film formation side composed of the Ga oxide in a field of view of 500 μm×500 μm. The conditions for this EBSD measurement were as follows.

<EBSD Measurement Conditions>
Acceleration voltage: 15 kV
Spot intensity: 70
Working distance: 22.5 mm
Step size: 0.5 μm
Sample tilt angle: 70°
Measurement program: Aztec (version 3.3)

From the obtained reverse pole figure orientation mapping, it was found that the Ga oxide film has a biaxially oriented corundum-type crystal structure in which the Ga oxide film was c-axis oriented in the substrate normal direction with in-plane orientation. From these, it was shown that an orientation film composed of α-Ga$_2$O$_3$ was formed.

(2c) Plane TEM of Film Forming Side Surface

Figure 4:
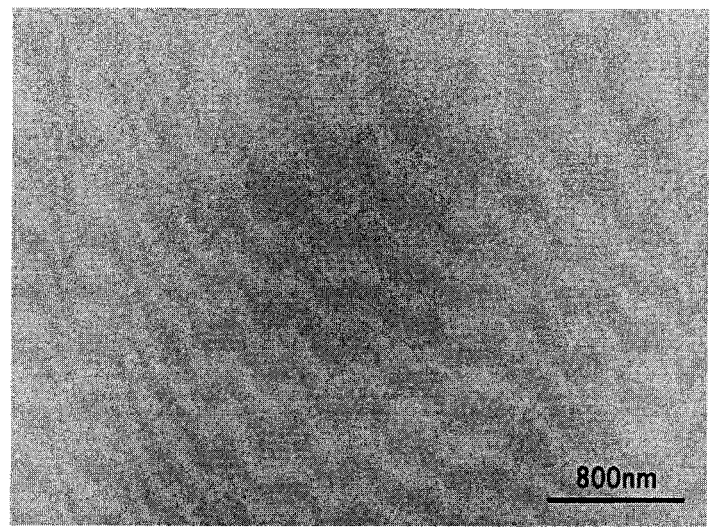
FIG. 4 is a TEM image of a film forming side surface of an $\alpha$-$Ga_2O_3$ film obtained in Example 1.
Figure 5:
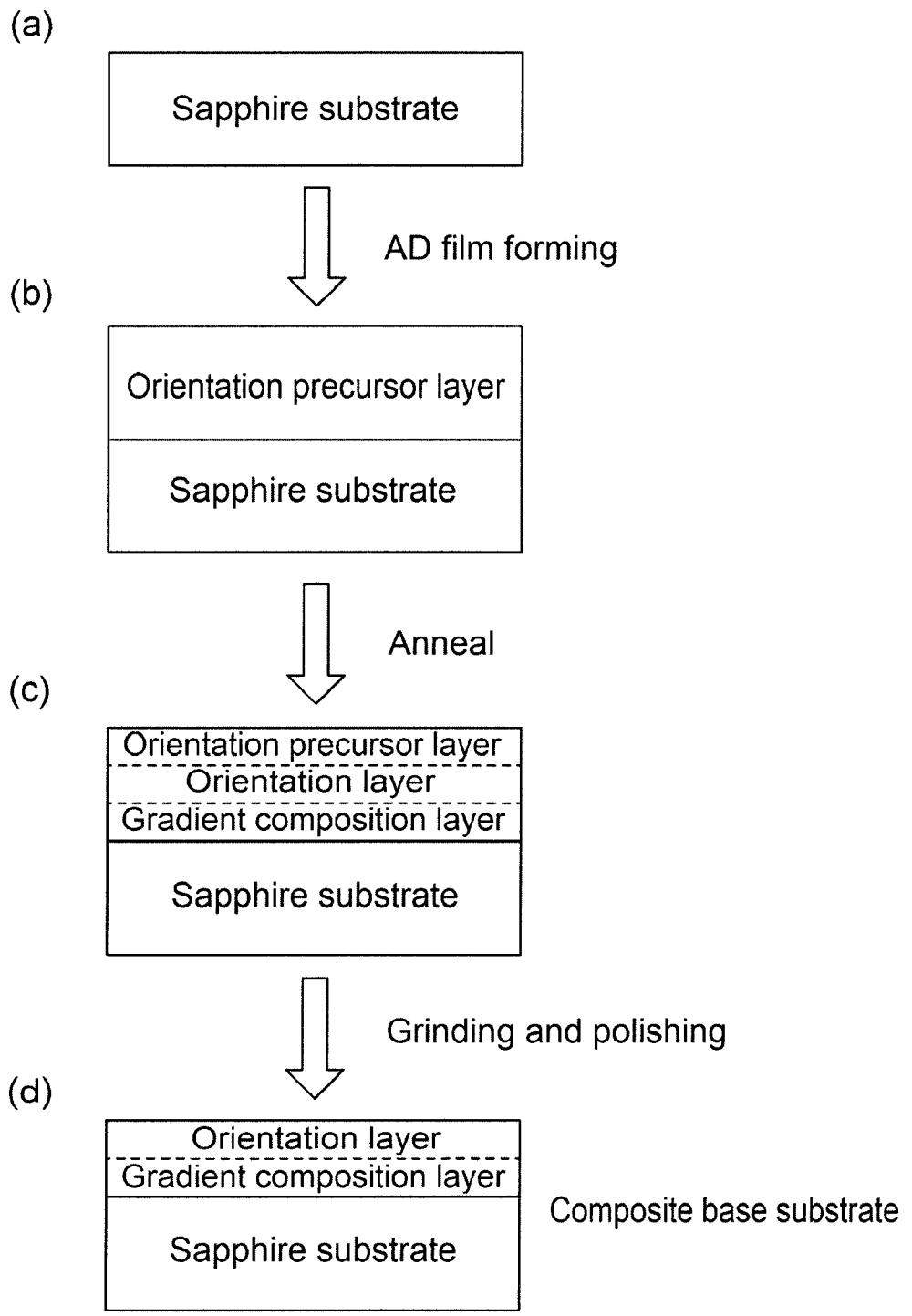
FIG. 5 is a diagram schematically showing a step of preparing a composite base substrate in Example 5.

Plane TEM observation (plan view) was performed to evaluate the crystal defect density of the α-Ga$_2$O$_3$ film. The test piece was cut out so as to include the surface on the film formation side, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed, and the number of defects observed therein was calculated. As a result, no crystal defect was observed in the obtained TEM images, and the crystal defect density was found to be less than $9.9 \times 10^5/\text{cm}^2$. An example of the obtained TEM image is shown in FIG. 4.

(2d) Plane TEM of Base Substrate for Film Formation Side Surface

In order to evaluate the crystal defect density of the surface of the α-Ga$_2$O$_3$ film opposite the surface observed in (2c) above (that is, surface adjacent to Cr$_2$O$_3$ substrate), a plane TEM observation (plan view) was performed. The test piece was cut out so as to include the film surface, and processed by ion milling so that the sample thickness (T) around the measurement field of view was 150 nm. The obtained sections were subjected to TEM observation at an acceleration voltage of 300 kV using a transmission electron microscope (H-90001UHR-I manufactured by Hitachi) to evaluate the crystal defect density. Actually, eight TEM images having a measurement field of view of 4.1 μm×3.1 μm were observed, and the number of defects observed therein was calculated. As a result, no crystal defect was observed in the obtained TEM images, and the crystal defect density was found to be less than $9.9 \times 10^5/\text{cm}^2$.

(2e) Cross-Section TEM

A cross-sectional test piece was cut out from the α-Ga$_2$O$_3$ film so that both the surface on the film forming side and the surface adjacent to the Cr$_2$O$_3$ substrate were included and the sample thicknesses (T) around the measurement field of view became 200 nm. Using the obtained test piece, TEM observation was performed at an acceleration voltage of 300 kV using a transmission electron microscope (H-90001UHR-I manufactured by Hitachi). As a result of measuring the thickness of the α-Ga$_2$O$_3$ film from the obtained TEM image, it was 0.7 μm.

(2f) XRC of Film Forming Side Surface

Using an XRD apparatus (D8-DISCOVER, manufactured by Bruker-AXS Inc.), XRC measurement was performed on the (104) plane of the film forming surface side surface of the α-Ga$_2$O$_3$ film. Actually, after adjusting 2θ, ω, χ, and φ to perform axial alignment so that the peak of the (104)

plane of α-Ga$_2$O$_3$ appears, conditions were used in which the tube voltage was 40 kV, the tube current was 40 mA, the collimator diameter was 0.5 mm, the anti-scattering slit was 3 mm, w was in the range of 15.5 to 19.5°, the w step width was 0.005°, and the counting time was 0.5 seconds. As the X-ray source, a Ge (022) asymmetric reflection monochromator was used to convert CuKα rays into parallel monochromatic light. The full width at half maximum (FWHM) in the obtained XRC profile of the (104) plane was determined by performing peak search after profile smoothing using XRD analysis software ("LEPTOS" Ver 4.03, manufactured by Bruker-AXS). As a result, the full width at half maximum of the (104) plane XRC profile of the α-Ga$_2$O$_3$ film was 127 arcsec.

(2g) Sn Concentration

The Sn concentration in the α-Ga$_2$O$_3$ film was measured using D-SIMS (IMS-7f manufactured by CAMECA). Cs$^+$ ion was used as the primary ion species at the time of measurement, and the measurement was performed at a primary ion acceleration voltage of 14.5 kV. As a result, the Sn concentration in the α-Ga$_2$O$_3$ film was below the detection limit.

Example 2

The formation of the α-Ga$_2$O$_3$ film and various evaluations were performed in the same manner as in Example 1 except that the raw material solution in (1b) was prepared as follows and the film formation time in (1d) was set to 130 minutes. The results were as shown in Table 1.

(1b') Preparation of Raw Material Solution

An aqueous solution having a gallium acetylacetonate concentration of 0.05 mol/L was prepared. At this time, 36% hydrochloric acid was contained in a volume ratio of 1.5%. Tin (II) chloride dihydrate (SnCl$_2$·2H$_2$O) was added to the obtained gallium acetylacetonate solution, and the concentration was adjusted so that the atomic ratio of tin to gallium was 0.2, thereby obtaining a raw material solution 64a.

Example 3

The formation of the α-Ga$_2$O$_3$ film and various evaluations were performed in the same manner as in Example 1 except that the temperature in the quartz tube 67 was set at 460° C. in (1c) and the film formation time in (1d) was set at 200 minutes. The results were as shown in Table 1. In this example, the crystal defect density on the film forming side surface of the α-Ga$_2$O$_3$ film was smaller than that on the base substrate for film formation side surface. Therefore, when (crystal defect density on bottom surface)/(crystal defect density on top surface) is calculated with the film forming side surface as the top surface and the base substrate for film formation side surface as the bottom surface, it was shown that the calculated values are larger than 1.

Example 4

The formation of the α-Ga$_2$O$_3$ film and various evaluations were performed in the same manner as in Example 2, except that tin (II) chloride dihydrate was added so that the atomic ratio of tin to gallium was $5.0 \times 10^{-6}$ in (1b'), the temperature in the quartz tube 67 was set at 460° C. in (1c), and the film formation time was set at 110 minutes in (1d). The results were as shown in Table 1. In this example, the crystal defect density on the film forming side surface was smaller than that on the base substrate for film formation side surface. Therefore, when (crystal defect density on bottom surface)/(crystal defect density on top surface) is calculated with the film forming side surface as the top surface and the base substrate for film formation side surface as the bottom surface, it was shown that the calculated values are larger than 1.

Example 5

The formation of the α-Ga$_2$O$_3$ film and various evaluations were performed in the same manner as in Example 2, except that a composite base substrate prepared as described below was used as the base substrate for film formation, tin (II) chloride dihydrate was added so that the atomic ratio of tin to gallium was 0.7 in (1b'), and the film formation time was set at 280 minutes in (1d). The results were as shown in Table 1.

(Preparation of Composite Base Substrate)

(a) Preparation of Orientation Precursor Layer

An AD film (orientation precursor layer) composed of Cr$_2$O$_3$ was formed on a seed substrate (sapphire substrate) by an aerosol deposition (AD) apparatus 20 shown in FIG. 1 using Cr$_2$O$_3$ powder (Colortherm Green manufactured by Lanxess) as the raw material powder and sapphire (diameter 50.8 mm (2 inches), thickness 0.43 mm, c-plane, off-angle 0.2°) as the substrate. The configuration of the aerosol deposition (AD) apparatus 20 is as described above.

The AD film formation conditions were as follows. That is, N$_2$ was used as a carrier gas, and a ceramic nozzle having a slit having a long side of 5 mm and a short side of 0.3 mm was used. The scanning conditions of the nozzle were to move 55 mm in the direction perpendicular to the long side of the slit and forward, to move 5 mm in the long side direction of the slit, to move 55 mm in the direction perpendicular to the long side of the slit and backward, and to move 5 mm in the long side direction of the slit and opposite to the initial position, repeatedly at a scanning speed of 0.5 mm/s, and at the time of 55 mm movement from the initial position in the long side direction of the slit, scanning was performed in the direction opposite to the previous direction, and the nozzle returned to the initial position. This was defined as one cycle, and repeated for 500 cycles. In one cycle of film formation at room temperature, the set pressure of the transport gas was adjusted to 0.06 MPa, the flow rate was adjusted to 6 L/min, and the pressure in the chamber was adjusted to 100 Pa or less. The AD film (orientation precursor layer) thus formed had a thickness of about 100 μm.

(b) Heat Treatment of Orientation Precursor Layer

The sapphire substrate on which the AD film (orientation precursor layer) was formed was taken out from the AD apparatus and annealed at 1700° C. for 4 hours in a nitrogen atmosphere.

(c) Grinding and Polishing

The obtained substrate was fixed to a ceramic surface plate, the surface on the side derived from the AD film was ground using a grinding stone having a grit size of #2000 or less until the orientation layer was exposed, and then the plate surface was further smoothed by lapping using diamond abrasive grains. At this time, lapping was performed while gradually reducing the size of the diamond abrasive grains from 3 μm to 0.5 μm, thereby improving the flatness of the plate surface. Thereafter, mirror finishing was performed by chemical mechanical polishing (CMP) using colloidal silica to obtain a composite base substrate having an orientation layer on a sapphire substrate. The surface of the substrate on the side derived from the AD film was designated as the "top surface". The arithmetical mean roughness Ra of the orientation layer top surfaces after processing was 0.1 nm, the amount of grinding and polishing was 50 μm, and the thicknesses of the composite base substrate after polishing was 0.48 mm.

(d) Evaluation of Orientation Layer (d1) Cross-Section EDX

The composition of the cross-section orthogonal to the main surface of the substrate was analyzed using an energy dispersive X-ray analyzer (EDX). As a result, only Cr and O were detected in the range from the top surface of the composite base substrate to a depth of about 20 μm. It was found that the ratio of Cr and O did not substantially change in the range of the depth of about 20 μm, and a Cr oxide layer having a thickness of about 20 μm was formed. Further, Cr, O and Al were detected in the range from the Cr oxide layer to a depth of 30 μm, and it was found that a Cr—Al oxide layer (gradient composition layer) having a thickness of about 30 μm was formed between the Cr oxide layer and the sapphire substrate. In the Cr—Al oxide layer, the ratios of Cr and Al were different, and it was observed that the Al concentration was high on the sapphire substrate side and decreased on the side close to the Cr oxide layer.

(d2) Surface EBSD

An SEM (SU-5000, manufactured by Hitachi High-Technologies Corporation) equipped with an electron backscatter diffraction apparatus (EBSD) (Nordlys Nano, manufactured by Oxford Instruments Inc.) was used to perform reverse pole figure orientation mapping of the top surface of the orientation layer composed of the Cr oxide layer in a field of view of 500 μm×500 μm. The conditions for this EBSD measurement were as follows.

<EBSD Measurement Conditions>

Acceleration voltage: 15 kV

Spot intensity: 70

Working distance: 22.5 mm

Step size: 0.5 μm

Sample tilt angle: 70°

Measurement program: Aztec (version 3.3)

From the obtained reverse pole figure orientation mapping, it was found that the Cr oxide layer was a layer having a biaxially oriented corundum-type crystal structure in which the Cr oxide layer was c-axis oriented in the substrate normal direction and was also oriented in the in-plane direction. From these, it was shown that the orientation layer composed of $\alpha$-$Cr_2O_3$ was formed on the substrate top surface. Based on the above results, the preparation step of the composite base substrate is schematically shown in FIGS. 5(a) to 5(d).

(d3) XRD

XRD in-plane measurement of the substrate top surface was performed using a multifunctional high-resolution X-ray diffraction (XRD) apparatus (D8 DISCOVER, manufactured by Bruker AXS Inc.). Specifically, after the Z axis was adjusted in accordance with the height of the substrate surface, the axis was set by adjusting Chi, Phi, ω, and 2θ with respect to the (11-20) plane, and 2θ–ω measurement was performed under the following conditions.

<XRD Measurement Conditions>

Tube voltage: 40 kV

Tube current: 40 mA

Detector: Triple Ge (220) Analyzer

CuKα rays converted to parallel monochromatic light (full width at half maximum 28 seconds) with a Ge (022) asymmetric reflection monochromator.

Step width: 0.001°

Scan speed: 1.0 second/step

From the XRD measurement, it was found that the a-axis length of the orientation layer was 4.961 Å.

Example 6

The formation of the $\alpha$-$Ga_2O_3$ film and various evaluations were performed in the same manner as in Example 5, except that tin (II) chloride dihydrate was added so that the atomic ratio of tin to gallium was 0.2 in (1b'), and the film formation time was set at 600 minutes in (1d). The results were as shown in Table 1.

TABLE 1

| | Film formation temperature (° C.) | Sn concentration (atom/$cm^3$) | Film thickness (μm) | Crystal defect density (/$cm^2$) Film forming surface side surface (top surface) | Crystal defect density (/$cm^2$) Base substrate for film formation side surface (bottom surface) | (104) plane XRC full width at half maximum FWHM (arcsec.) |
|---|---|---|---|---|---|---|
| Example 1 | 600 | — | 0.7 | less than $9.9 \times 10^5$ | less than $9.9 \times 10^5$ | 127 |
| Example 2 | 600 | $1.3 \times 10^{19}$ | 1.5 | less than $9.9 \times 10^5$ | less than $9.9 \times 10^5$ | 131 |
| Example 3 | 460 | — | 2.3 | less than $9.9 \times 10^5$ | $9.9 \times 10^5$ | 348 |
| Example 4 | 460 | $1.1 \times 10^{16}$ | 1.3 | less than $9.9 \times 10^5$ | $2.0 \times 10^6$ | 438 |
| Example 5 | 600 | $1.2 \times 10^{20}$ | 3.2 | less than $9.9 \times 10^5$ | less than $9.9 \times 10^5$ | 62 |
| Example 6 | 600 | $1.0 \times 10^{19}$ | 7.1 | less than $9.9 \times 10^5$ | less than $9.9 \times 10^5$ | 35 |

What is claimed is:

1. A semiconductor film having a corundum-type crystal structure composed of $\alpha$-$Ga_2O_3$ or an $\alpha$-$Ga_2O_3$ solid solution, wherein at least one surface of the semiconductor film has a crystal defect density of $1.0 \times 10^6$/$cm^2$ or less.

2. The semiconductor film according to claim 1, wherein a ratio of a crystal defect density on a surface (bottom surface) opposite one surface (top surface) of the semiconductor film to a crystal defect density on the one surface of the semiconductor film exceeds 1.0.

3. The semiconductor film according to claim 1, wherein an X-ray rocking curve full width at half maximum of a (104) plane on at least one surface of the semiconductor film is 500 arcsec or less.

4. The semiconductor film according to claim 1, wherein the semiconductor film contains a Group 14 element as a dopant at a proportion of $1.0 \times 10^{16}$ to $1.0 \times 10^{21}$/$cm^3$.

5. The semiconductor film according to claim 1, wherein the semiconductor film is a c-axis orientation film.

6. The semiconductor film according to claim 1, which is provided on a support substrate having a coefficient of thermal expansion at 25 to 400° C. of 6 to 13 ppm/K.

7. The semiconductor film according to claim 6, wherein the support substrate is composed of a Cu—Mo composite material.

\* \* \* \* \*